Figure 1:
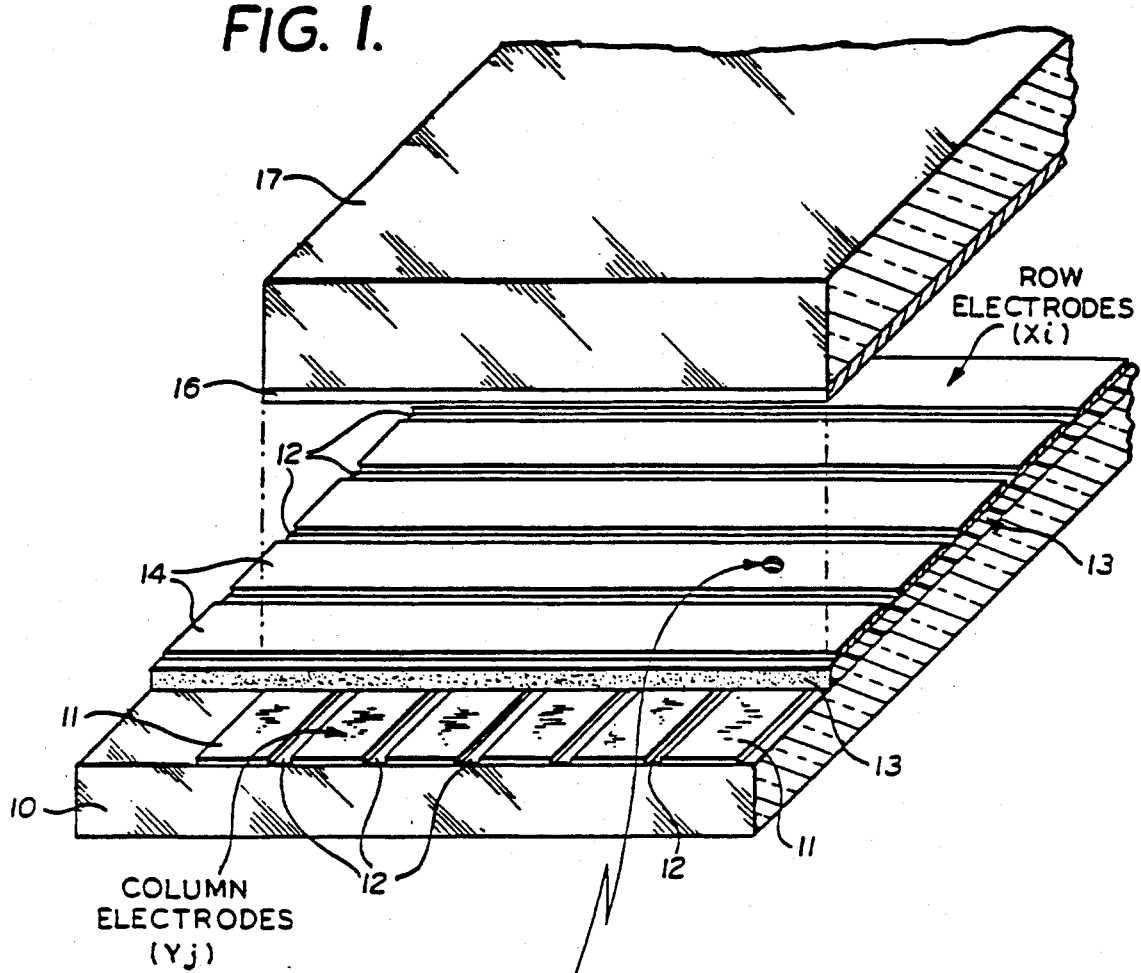

United States Patent [19]

White

[11] Patent Number: 4,650,288

[45] Date of Patent: Mar. 17, 1987

[54] ELECTRICALLY CONDUCTIVE MATERIALS FOR DEVICES

[75] Inventor: Roger P. White, Yonkers, N.Y.

[73] Assignee: North American Philips Corporation, New York, N.Y.

[21] Appl. No.: 889,299

[22] Filed: Jul. 21, 1986

Related U.S. Application Data

[63] Continuation of Ser. No. 511,618, Jul. 7, 1983, abandoned.

[51] Int. Cl.⁴ .................. G02B 26/04; G09G 3/34; G03C 1/60
[52] U.S. Cl. .................................. 350/362; 340/787; 430/191; 430/198
[58] Field of Search .............. 430/191, 198; 350/355, 350/362, 356, 357; 340/787

[56] References Cited

U.S. PATENT DOCUMENTS

| 3,443,944 | 5/1969 | Wise | 430/198 |
| 3,754,912 | 8/1973 | Jones et al. | 430/198 |
| 4,203,106 | 5/1980 | Dalisa et al. | 340/787 |

Primary Examiner—Bruce Y. Arnold
Attorney, Agent, or Firm—Paul R. Miller

[57] ABSTRACT

An electrically conductive photoresist electrode is formed by a combination of a photoresist and conductive black powder. This conductive photoresist has the properties of being photosensitive, electrically conductive, and black to avoid reflectivity by the electrode structure, as occurs in display devices.

6 Claims, 2 Drawing Figures

ELECTRICALLY CONDUCTIVE MATERIALS FOR DEVICES

This is a continuation of application Ser. No. 511,618, filed July 7, 1983, now abandoned.

The present invention is directed to an improvement in structures utilizing conductive photoresist electrodes. In particular, electrophoretic imaging display (EPID) devices are described using a blackened control electrode, but the use of conductive photoresists, blackened or otherwise, may be provided in numerous structures for electrodes.

Electrophoretic display devices with control electrodes may be seen, for example, in U.S. Pat. No. 4,203,106 to Dalisa et al. This reference provides the background to the type of device for which the present invention is particularly useful.

In such EPID devices, materials used for control electrodes are often either an evaporated aluminum film or an evaporated indium oxide ($In_2O_3$) film. These electrode materials have certain disadvantages. In particular, an aluminum conductive film is highly reflective. Further, these materials have questionable adhesion to insulating materials such as used in EPID devices. Conductor cracking and possible flaking causes open or short circuits in these devices. Also, these materials must be patterned with a photoresist-etching procedure in order to be properly formed.

Of these disadvantages, the most serious are high reflectivity and poor adhesion of the electrode material. In a control grid EPID device this causes the device to resemble a mirror at most viewing angles and reduces the contrast and readability of the device to unacceptable levels. Short circuits render the display unusable.

The present invention seeks to provide electrically conductive photoresists, such as can be used as control grid electrodes in an EPID, device which will obviate the above difficulties.

In particular, the formation of a control electrode in an EPID device having the properties of being photosensitive when required, electrically conductive, and black solves the foregoing difficulties.

Figure 2:
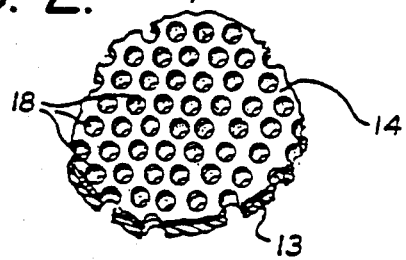

The arrangements of the presently claimed invention may be seen more clearly by reference to the drawing figure which illustrates without limitation an embodiment of the present invention, and wherein:

FIG. 1 illustrates an expanded view of the electrode structure in an EPID device, and FIG. 2 illustrates a structure for the control electrode in such device.

An electrophoretic device with a control grid is constructed generally as seen in FIG. 1. In such a structure, a substrate panel 10 is provided on its surface with a plurality of parallel transparent conductive strips adherent to a surface of the substrate, which strips serve as column electrodes 11. Such electrodes may typically be formed of indium oxide applied to the panel by means of a sputtering technique, for example.

The substrate 10 and electrodes 11 are then covered with an insulating layer 13 composed of a photoresist or other dielectric which might be applied by a process of dip coating, for example. A plurality of row electrodes 14 are then adherently applied to the surface of the insulating layer 13 in the form of parallel strips extending transversely to the column electrodes. These row electrodes 14, as well as the underlying insulating layer 13, are then patterned with minute pockets or holes 18 which are shown in an enlarged portion in FIG. 2. The holes 18 are not shown in FIG. 1 in order to avoid cluttering of the drawing. The row electrodes 14 may act as a control electrode for the EPID device.

A second substrate panel 17 is then provided parallel to the first panel 10 with a plane major surface facing the first panel 10. This surface is coated with an electrode layer 16 which is a continuous transparent electrode layer of indium oxide, for example. An electrophoretic solution (not shown) is placed between the two panels and electrodes.

In such an arrangement for an EPID structure, the present invention enables the control electrode 14 to be formed in a manner to avoid high reflectivity so as to avoid the control electrode from resembling a mirror.

This occurs, for example, by constructing the electrode 14 from a mixture of one part of carbon powder, such as lamp black powder, to two parts of a photoresist material by volume. This combined form is mixed and a conductive photoresist is obtained which is photosensitive, is electrically conductive, and has a black color.

The photoresist material may be a commercial photoresist such as Shipley AZ 1350B. Other examples are AZ 4110 and AZ 1450 of the Azoplate division of American Hoechst Corp.; Kodak 809 and 820 of Kodak Corp.; and Selectilux P of EM Chemicals, all of which are positive type photoresist materials. Negative type photoresists, such as Kodak 747 and Selectilux N, can also be used.

Using such materials as the control electrode in an EPID device, such as that of FIG. 1, will achieve conduction as required, as well as provide a non-reflective surface. Moreover, this material of the present invention has an excellent adhesion to the insulating layer 13. Since it is a photoresist, it can be easily patterned in the form of the patterned electrode of FIG. 2.

The formation of the electrically conductive photoresist could also be achieved with other conducting materials, such as silver, for example. The amount of conductive material loadings could be varied to change the conductivity.

It is highly likely that such a material would be extremely useful for thick film resistors where high curing temperatures, normally used with thick film pastes, are prohibitive. As an example, conductive contacts for materials, such as triglycinesulfate or TGS, may provide a good thick film of material according to the invention for infrared radiation detectors.

While one example to the present invention has been illustrated and described, the present invention includes all variations and features which may be evident from the claims.

What I claim is:

1. An electrically conductive layer consisting essentially of a combination of a photoresist and a conductive material, wherein said conductive material is black powder, wherein said black powder is carbon powder, and wherein said carbon powder and said photoresist are present in an amount of one part carbon and two parts photoresist.

2. In a display device comprising a solution sandwiched between substrates, and electrically conductive portions facing said solution formed on said substrates, the improvement comprising at least one of said electrically conductive portions being a photosensitive blackened photoresist.

3. A display device according to claim 2, wherein said solution is an electrophoretic solution.

4. A display device according to claim 3, wherein said at least one electrically conductive portion includes a control electrode at one side of said electrophoretic solution.

5. In a display device comprising a solution sandwiched between substrates, and electrically conductive portions facing said solution formed on said substrates, the improvement comprising at least one of said electrically conductive portions being a photosensitive blackened photoresist, wherein said blackened photoresist includes one part carbon powder and two parts photoresist.

6. In a display device comprising a solution sandwiched between substrates, and electrically conductive portions facing said solution formed on said substrates, the improvement comprising at least one of said electrically conductive portions being a photosensitive blackened photoresist, wherein said solution is an electrophoretic solution, wherein said at least one electrically conductive portion includes a control electrode at one side of said electrophoretic solution, and wherein said control electrode includes one part carbon and two parts photoresist.

* * * * *